United States Patent [19]

Estrada

[11] Patent Number: 4,945,265
[45] Date of Patent: Jul. 31, 1990

[54] ECL/CML PSEUDO-RAIL CIRCUIT, CUTOFF DRIVER CIRCUIT, AND LATCH CIRCUIT

[75] Inventor: Julio R. Estrada, South Portland, Me.

[73] Assignee: National Semiconductor Corporation, Santa Clara, Calif.

[21] Appl. No.: 379,088

[22] Filed: Jul. 13, 1989

[51] Int. Cl.$^5$ .......................................... H03K 19/086
[52] U.S. Cl. ................................... 307/455; 307/473; 307/475; 307/494; 307/296.4; 307/552
[58] Field of Search ............... 307/443, 455, 473, 475, 307/494, 552, 598, 272.2, 296.4

[56] References Cited

U.S. PATENT DOCUMENTS

| | | | |
|---|---|---|---|
| 4,647,799 | 3/1987 | Hsu et al. | 307/455 |
| 4,678,935 | 7/1987 | Nawata et al. | 307/443 X |
| 4,698,527 | 10/1987 | Matsumoto | 307/455 X |
| 4,806,800 | 2/1989 | Khan | 307/494 X |
| 4,823,028 | 4/1989 | Lloyd | 307/455 X |
| 4,838,900 | 11/1989 | Umeki | 307/473 |
| 4,857,776 | 8/1989 | Khan | 307/473 X |
| 4,870,301 | 9/1989 | Petty | 307/473 X |

*Primary Examiner*—David Hudspeth
*Attorney, Agent, or Firm*—Lee Patch; Daniel H. Kane

[57] ABSTRACT

A pseudo-rail circuit is coupled between the differential output gate or buffer of an emitter coupled logic or current mode logic (ECL/CML) circuit and the high potential level power rail. The pseudo-rail circuit provides a pseudo-rail node. A first clamp circuit is coupled to the pseudo-rail node for clamping the pseudo-rail node at a first potential level in response to a first control signal. A second clamp circuit is coupled to the pseudo-rail node for clamping at a second potential level in response to a second control signal. A clamp switching circuit alternately applies the first and second clamp circuits to the pseudo-rail node in response to the control signals. As a cutoff driver circuit, the first clamp circuit of the pseudo-rail circuit applies the high potential level of the power rail to the pseudo-rail node. The second claim circuit pulls down the pseudo-rail node to hold the output of the differential output gate in the cutoff state. An output enable (OE) differential gate or buffer provides the clamp switching circuit. The pseudo-rail circuit is incorporated directly in a latch circuit to initiate the cutoff state in response to an OE cutoff signal without losing latched data and without requiring an additional output buffer stage.

19 Claims, 4 Drawing Sheets

ECL/CML PSEUDO-RAIL CIRCUIT, CUTOFF DRIVER CIRCUIT, AND LATCH CIRCUIT

TECHNICAL FIELD

This invention relates to emitter coupled logic and current mode logic (ECL/CML) circuits with a differential gate or buffer. The invention provides a pseudo-rail circuit coupled between the differential gate and the high potential level power rail. The invention is applicable as an ECL/CML cutoff driver circuit and is useful for example in latch circuits for preserving latched data in the cutoff state. The invention is also applicable for logic circuits requiring multi-level voltage signals such as, for example, three valued logic and multi-valued logic circuits.

BACKGROUND ART

A standard ECL output gate with an ECL cutoff driver circuit is illustrated in FIG. 1. The basic ECL gate is a differential gate provided by the gate transistors Q1 and Q3. In this example gate transistor Q1 provides an input transistor element for receiving input signals of high and low potential. Gate transistor Q3 provides a reference transistor element to which a reference voltage signal is applied at an intermediate reference voltage level between the high and low potential input signal levels. The emitter terminals of differential gate transistors Q1 and Q3 are coupled together at a common emitter node coupling. Current sink I1 is coupled between the common emitter node coupling and the low potential level power rail designated $V_{EE}$.

The current sink I1 is typically a current source transistor element with a tail resistor in its emitter current path for generating the sink current or tail current. A bias voltage generator, not shown, provides the current source voltage applied to the base of the current source transistor element of the current sink I1.

The ECL differential gate transistor elements Q1 and Q3 provide alternative current paths through respective collector path swing voltage resistors R1 and R2 which are in turn coupled to the high potential level power rail. In this example the high potential level power rail $V_{CC}$ is at ground potential, and is also designated GND. Typically the swing voltage resistor elements R1 and R2 have substantially equal resistance. Current sink I1 generates the ECL differential gate current in one of the alternative current paths through either of the swing resistors R1 or R2 according to the input signal IN at the base of input transistor element Q1. Because the inverting output is selected for use in this prior art example of FIG. 1, the input signal may be previously inverted to provide an inverted input signal DN for a true output signal at output OUT.

Typical ECL gates may also be constructed according to the differential signal input configuration with differential base input circuits. In the differential signal input ECL gate circuit configuration, the differential gate transistors Q1 and Q3 constitute differential input transistors for complementary inputs IN and DN rather than functioning as an input transistor element and reference transistor element as illustrated. Either type of gate is referred to herein as an ECL differential gate or simply a differential gate or ECL gate.

As further shown in FIG. 1 the ECL gate output signals are taken from the collector node of gate transistor Q1. The collector node is an output switching node which provides output signals of high and low potential through output buffer emitter follower transistor element Q5 to the output OUT. While the collector node of gate transistor Q1 provides the true output signal for an inverted input signal DN, a complemented output signal, not shown, may also be taken from the collector node of gate transistor Q3.

The conventional output cutoff driver circuit for the ECL output differential gate is provided by an output enable (OE) differential gate. The OE differential gate includes OE gate transistor elements Q2 and Q4 in which transistor element Q2 provides the OE input transistor element or cutoff driver transistor element, and transistor element Q4 provides the OE reference transistor element. The OE gate transistor elements Q2 and Q4 are coupled together at a common emitter node coupling, and current sink I2 is coupled between the common emitter node coupling of OE gate transistors Q2 and Q4 and the low potential power rail $V_{EE}$. OE input signal transistor element Q2 is a multiemitter transistor element with emitter nodes coupled respectively to current sinks I1 and I2 for supplying both current sinks during the cutoff state as hereafter described.

During normal switching operation of the ECL output gate and the output switching node of gate transistor element Q1, the OE signal is low and OE gate transistor element Q2 is off. The OE gate transistor element Q4 therefore carries the tail current for current sink I2. For the cutoff state, the OE signal is high and OE transistor Q2 turns on. With transistor element Q2 conducting, the multiemitter currents satisfy both the current sinks I1 and I2, turning off transistor elements Q3 and Q4. The total sinking current through both current sinks I1 and I2 is forced through load resistor element R1. The abnormally large current causes a large voltage drop across resistor element R1. As a result the voltage level at the collector node of input transistor Q1, and the output OUT, drops below the cutoff potential level approaching a load termination voltage $V_{TT}$ of, e.g. $-2$ v. The ECL output OUT is therefore held in the cutoff or high impedance state for applications with multiple ECL output gates on a common bus. In common bus applications, one ECL output gate may be in the active switching mode while the others are held in the cutoff or high impedance state.

One disadvantage of the conventional ECL output gate cutoff driver circuit is the large power dissipation required in the cutoff state. Power dissipation increases as the number of output gates increases, forcing an increasing number of large currents through load resistors. A high power OE driver is also required to drive multiple bit circuits for multi-bit output gates such as hex-buffers or octal buffers.

Another disadvantage of the conventional ECL output gate cutoff driver circuit is that an extra output buffer stage is required if the differential output gate is incorporated in a latch circuit. This is because the feedback signal which holds the latched data signal is also taken from the collector node or output switching node for example of transistor Q1. The feedback signal and latched data bit may be lost in the cutoff state if the cutoff driver circuit is applied directly to a differential gate in the latch circuit. In the cutoff state the output switching node and output are forced to a cutoff low potential level. If the starting output logic signal level were at high potential followed by transition to the cutoff state, the latched date signal would be lost upon transition to the cutoff state. As a result an additional ECL differential gate output buffer stage is required to accommodate the ECL cutoff driver circuit separate from the latch circuit with an additional stage delay.

By way of example a prior art TTL to ECL latch circuit is illustrated in FIG. 2. The TTL input data signals are received at the input buffer stage for sequential input to the flip-flop master latch and slave latch sequential stages. With the clock input signal CLK low the date progresses with delay through the master latch and slave latch stages to the output buffer stage. With the OE signal input low an ECL compatible data output signal is provided. With a clock high signal at the CLK input to the latch stages, the propagating data signals are latched for temporary storage. With an OE signal high at the OE input to the output buffer, the ECL output and output buffer differential gate are held in the cutoff state.

The logical contents of the slave latch are shown in simplified form in FIG. 2A. The slave latch circuit incorporates feedback circuits between the logic gates for holding latched data. The data output node also forms a feedback node for one of the feedback circuits. A cutoff driver applied directly at this output and feedback node would interfere in the feedback circuit. For example with a high level signal at the data output node and feedback node of the slave latch followed by an OE high signal to a cutoff driver incorporated directly into the slave latch circuit, the output node and feedback node are both pulled down to the cutoff condition with loss of the previous state and stored data signal of the latch. For this reason the separate output buffer stage for the OE cutoff driver circuit is required with additional stage delay as illustrated in FIG. 2.

OBJECTS OF THE INVENTION

It is therefore an object of the present invention to provide a new ECL output gate cutoff driver circuit for application in ECL differential gates and buffers with reduced power dissipation particularly in multiple bit output differential gate applications.

Another object of the invention is to provide a new ECL cutoff driver circuit which may be incorporated directly in a latch circuit for achieving the cutoff state at the latch circuit output without loss of latched data signals. It is the object of the invention to incorporate the ECL differential gate output buffer and ECL cutoff driver circuit directly into the latch circuit without requiring an additional output buffer stage or additional stage delay.

More generally it is the object of the invention to provide a new ECL/CML pseudo-rail circuit for coupling between an ECL/CML differential gate and the high potential level rail for a variety of applications including, for example, multi-valued logic applications requiring multiple voltage level signals.

DISCLOSURE OF THE INVENTION

In order to accomplish these results the invention provides a new pseudo-rail circuit for ECL/CML differential gates or buffers. The pseudo-rail circuit is coupled between the differential gate and the high potential level power rail. The pseudo-rail circuit includes a pseudo-rail node with a first clamp circuit coupled to the pseudo-rail node for clamping the pseudo-rail node substantially at a first potential level in response to a first control signal. The pseudo-rail circuit also includes at least a second clamp circuit coupled to the pseudo-rail node for clamping the pseudo-rail node at a second potential level below the first potential level in response to a second control signal.

The pseudo-rail circuit incorporates a clamp switching circuit coupled to the first and second clamp circuits for alternately applying the first and second clamp circuits to the pseudo-rail node in response to the first and second control signals. This clamp switching circuit may take the form of an output enable (OE) control signal differential gate with one of the OE gate transistor elements coupled to the first and second clamp circuits. The alternately conducting OE differential gate transistor element alternately applies the first and second clamp circuits to the pseudo-rail node in response to first and second OE control signals.

The invention thus provides a bi-level clamp circuit or bias network circuit. Additional clamp circuits may also be incorporated in the pseudo-rail circuit or bias network circuit with additional switching clamp circuits for multilevel clamping and biasing.

In the preferred example embodiment the first clamp circuit applies the high potential level of the high potential level power rail to the pseudo-rail node. This is accomplished for example using a first clamp circuit with a clamp emitter follower transistor element coupled to the pseudo-rail node, and an inverse voltage drop component coupled between the clamp emitter follower transistor element and the high potential level power rail. The inverse voltage drop component has a voltage drop substantially equal and opposite to the voltage drop across the clamp emitter follower transistor element for applying the high potential level of the high potential level power rail to the pseudo-rail node.

The second clamp circuit also incorporates the clamp emitter follower transistor element coupled to the pseudo-rail node and also a pulldown transistor element coupled between the clamp emitter follower transistor element and the low potential level power rail. A voltage level setting circuit is coupled to the node between the clamp emitter follower transistor element and the pulldown transistor element for holding the pseudo-rail node at a specified potential level below the high potential level of the high potential level power rail when the pulldown transistor element is conducting. The pulldown transistor element is the OE input transistor element of the OE differential gate.

In the preferred example the pseudo-rail circuit provides a cutoff driver circuit and the differential gate includes an output switching node for delivering output signals to an output. The output switching node is coupled to the pseudo-rail node. The second potential level of the second clamp circuit is selected to hold the output switching node and output of the differential gate in the cutoff state in response to a cutoff OE control signal.

Where the differential gate is part of a latch circuit which includes a feedback circuit for holding latched data, the switching output node of the differential gate is generally coupled to an output for delivering output signals, and to a feedback circuit of the latch circuit for delivering feedback signals to hold latched data. A feature and advantage of the pseudo-rail circuit of the invention is that, as a cutoff driver circuit, it holds the differential gate and output in the cutoff state in response to an OE cutoff signal without losing latched data.

This is accomplished because the pseudo-rail circuit according to the invention is interposed between the differential gate and the high potential level power rail effectively decoupling or disconnecting the differential gate from the direct effect of the high potential level power rail. In the context of a latch circuit the advantage of this arrangement is that the effective high potential rail level is relatively depressed or reduced for the entire latch circuit by means of the pseudo-rail node. Because the direct input, output, and feedback circuits of the latch operate with respect to each other according to relative signal voltage levels, latched data held by the feedback circuits is preserved in the cutoff state. On the other hand in a conventional latch circuit the conventional cutoff driver circuit would pull down the latch circuits to the same absolute level with consequent loss of a previously latched data signal.

The pseudo-rail circuit of the present invention may also be used to provide "trinary" or three level logic and other multi-valued logic signals by shifting the effective "high" voltage level of the upper potential level power rail. By shifting the pseudo-rail node between first and second upper potential levels, and with a fixed low potential level power rail at a third lower level, three voltage levels are available to represent three logic signals. For example, for ECL/CML three valued logic, voltage level signals at $-950$ mV, $-1700$ mV and $-2450$ mV may be available to represent the logic values with 750 mV separation between logic levels. More generally, the circuit of the invention is available for any ECL/CML logic circuit applications requiring multiple voltage level signals.

Other objects, features and advantages of the invention are apparent in the following specification and accompanying drawings.

DESCRIPTION OF THE PREFERRED EXAMPLE EMBODIMENTS AND BEST MODE OF THE INVENTION

Figure 1:
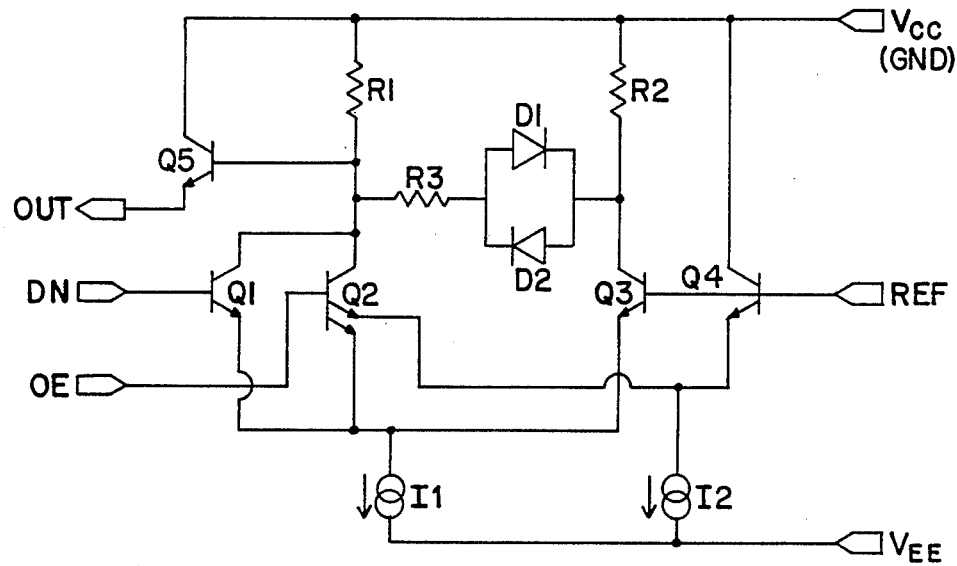
FIG. 1 is a schematic circuit diagram of a prior art ECL differential output gate or output buffer with the ECL cutoff driver circuit incorporated into the gate.
Figure 3:
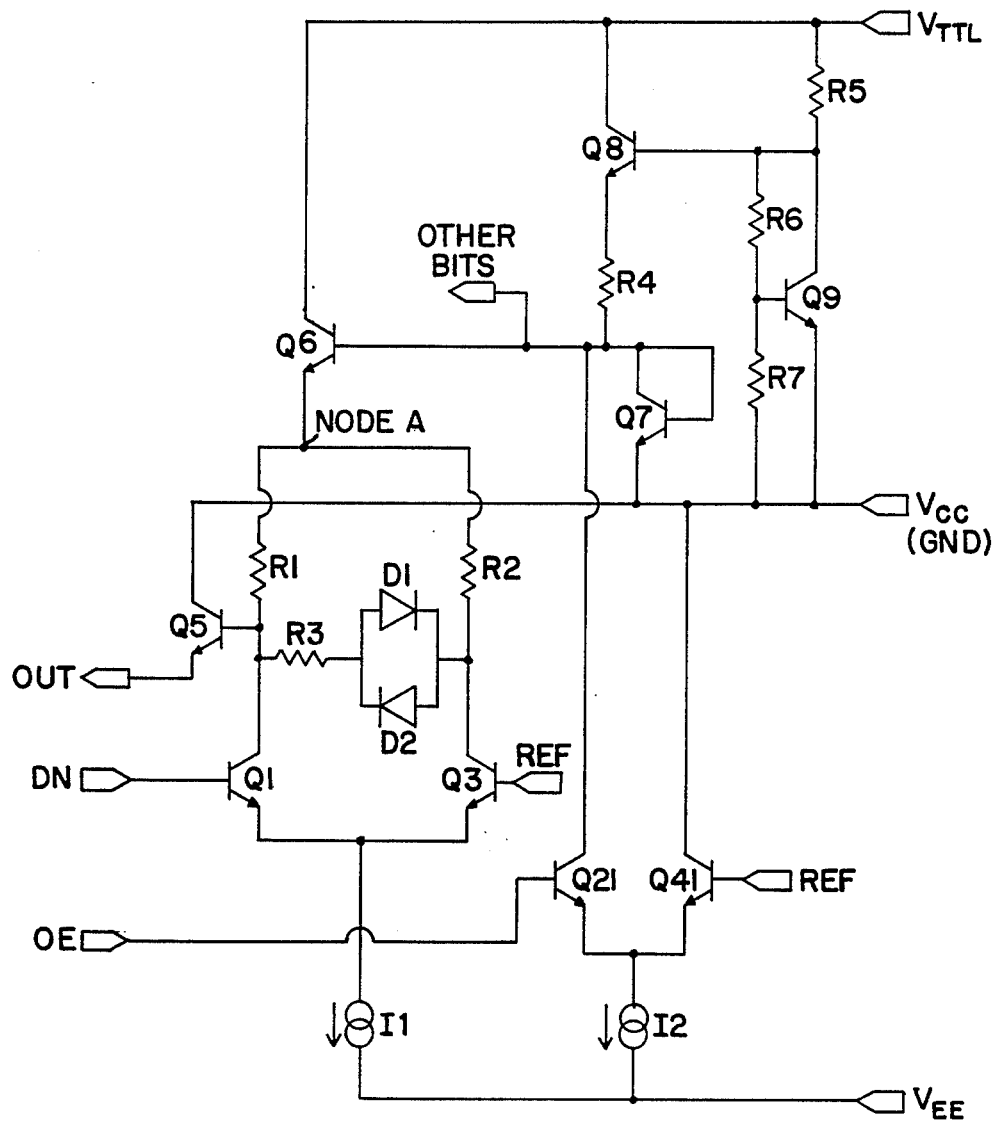
FIG. 3 is a schematic circuit diagram of an ECL differential output gate or output buffer incorporating a pseudo-rail circuit according to the invention for providing the cutoff driver circuit.

An ECL output gate incorporating the pseudo-rail circuit of the invention as a cutoff driver circuit is illustrated in FIG. 3. The components of the circuit and in particular the components of the output gate performing the same functions as the circuit of FIG. 1 are indicated by the same reference designations. In the circuit of FIG. 1 the output gate is coupled to and operates directly between the high potential level power rail, designated herein GND or $V_{CC}$, and the low potential level power rail designated $V_{EE}$. On the other hand in the circuit of the invention illustrated in FIG. 3 the output gate is disconnected or decoupled from the high potential level power rail GND and is instead connected to a pseudo-rail node, designated NODE A of the pseudo-rail circuit.

The pseudo-rail circuit incorporates first and second level clamp circuits as hereafter described coupled to NODE A, and which are in turn coupled to the output enable (OE) input buffer differential gate provided by transistor elements Q21, Q41. The OE input buffer circuit functions as a clamp switching circuit as hereafter described. The transistor elements of the OE buffer circuit are designated Q21 and Q41 to distinguish them and the function they perform from the cutoff driver transistor element Q2 and corresponding reference transistor element Q4 incorporated directly in the output gate of FIG. 1.

Emitter follower transistor element Q6 is coupled directly to NODE A and provides a clamp emitter follower transistor element for the pseudo-rail clamp circuits. The high potential end of swing resistors R1 and R2 of the ECL differential output gate are connected to the emitter of clamp emitter follower transistor element Q6 at NODE A. The first or high level clamp circuit is provided by the clamp emitter follower transistor element Q6 and the base collector shorted (BCS) transistor element Q7 coupled between the base node of transistor element Q6 and the actual high potential level power rail GND. When both transistor elements Q6 and Q7 are conducting, pseudo-rail NODE A is effectively clamped at the high potential level of power rail GND for normal bistate switching operation of the ECL output gate provided by the gate transistor elements Q1 and Q3. While the base node of clamp emitter follower transistor element Q6 is 1 $V_{BE}$ above the $V_{CC}$ ground through the base to emitter junction of BCS transistor element Q7, the base to emitter junction of transistor element Q6 provides an equal and opposite voltage drop of 1 $V_{BE}$ to the pseudo-rail NODE A. As a result, NODE A becomes the pseudoground or high potential level pseudo-rail.

The high level clamp circuit or first level clamp circuit is operative when the OE signal at the OE differential gate is low and transistor element Q21 is not conducting. The current sink I2 of the OE differential gate or cutoff state gate is satisfied through the reference transistor element Q41. Transistor element Q8 provides drive current through resistor R4 into the base of BSC transistor element Q7 so that it is conducting and also provides the necessary base drive current for the clamp emitter follower transistor element Q6. Current source transistor element Q8 also provides the drive current into all other clamp emitter follower transistor elements corresponding to transistor element Q6 for other differential output gates, for example in multi-bit circuits such as hex circuits or octal circuits, that may be driven or controlled by the pseudo-rail circuit. The power supply for current source transistor element Q8 is provided by a third power rail designated $V_{TTL}$. Biasing components including transistor Q9 and resistor elements R5, R6 and R7 establish the current source bias voltage at the base of current source transistor element Q8.

While the third power supply power rail $V_{TTL}$ provides the necessary power for operation of the clamp circuits of the pseudo rail circuit, the ECL output gate provided by gate transistors Q1, Q3 continues to operate effectively between the high and low potential level power rails $V_{CC}$ (GND) and $V_{EE}$. By way of example the potential level of the power supply power rail $V_{TTL}$ may be $+5$ volts, the $V_{CC}$ or ground power rail may be 0 volts and the low potential level power rail $V_{EE}$ may be −5 volts.

The second clamp circuit of the pseudo-rail circuit is operative to pulldown the potential level NODE A below ground potential when an OE high signal is applied at the base of transistor element Q21 of the OE differential gate. The OE differential gate or cutoff gate is provided by transistor elements Q21 and Q41, and current sink I2. With transistor element Q21 conducting, the current sink I2 sinks the current from current source transistor element Q8 across resistor element R4. Transistor element Q7 of the first clamp circuit becomes non-conducting and the larger voltage drop across resistor element R4 pulls down the potential level at the pseudo-ground NODE A below the ground potential level of 0 volts. Component values are selected so that the voltage level at NODE A is pulled down to for example −1.5 volts holding the output OUT and the output switching nodes of the differential output gate in the cutoff state. For this purpose, the output OUT is terminated typically through a 50 loud resistor to a terminating voltage supply $V_{TT}$ of −2 v.

If the potential level for the data signals are selected for example for a logic high level of −1.4 volts, a logic low level of −2.0 volts, a reference voltage level of −1.7 volts and a cutoff state voltage level of −1.5 volts at NODE A, saturation of the operative transistor elements is avoided for ECL operation.

It is apparent that while the first clamp circuit portion of the pseudo-rail circuit consisting of clamp emitter follower transistor element Q6 and BSC transistor Q7 provides the high side clamp, the second circuit provides the low side clamp. The components of the second clamp portion of the pseudo-rail circuit include the clamp emitter follower transistor element Q6, current source emitter follower transistor element Q8 and resistor element R4. With a high OE signal and transistor element Q21 of the OE input buffer or cutoff gate conducting, transistor element Q6 becomes a follower, and the voltage level at NODE A follows down the voltage at the collector node of OE gate transistor element Q21 which functions as a pulldown transistor element.

The cutoff voltage level established by the second clamp circuit portion of the pseudo-rail circuit is set below the ground potential level by the selection of the values of the resistance of resistor element R4 and the current of current sink I2. The current source bias voltage at the base node of current source transistor element Q8 is 2 $V_{BE}$ above the $V_{CC}$ ground level. The emitter node of transistor element Q8 is therefore 1 $V_{BE}$ above $V_{CC}$ ground. The selection of the resistance value of resistor R4 sets the voltage swing at NODE A. The voltage level at the base of clamp emitter follower transistor element Q6 is $V_{BE}$-I2R4. The voltage level at NODE A established by the second clamp circuit portion is therefore $V_{BE}$-I2R4-$V_{BE}$Q6 when the OE signal is high. The NODE A voltage is therefore I2R4 below the ground potential level. As set forth in the example above the components may be selected for a cutoff voltage level of −1.5 volts at the NODE A with consequent lower potential level at the output OUT.

The pseudo-rail circuit thus provides a biasing network or bilevel clamping network for the base node of clamp emitter follower transistor element Q6. The first clamp circuit or high level clamp circuit portion clamps the voltage level of NODE A at effectively the ground potential of the high potential level power rail $V_{CC}$. The second clamp circuit portion pulls down and holds the voltage level of NODE A at the cutoff state. NODE A is thus controlled and switched between ground on the high side and a cutoff potential on the low side. The switch between the two clamp levels is provided by the OE input buffer or cutoff gate Q21, Q41, I2 and in particular the OE input transistor element Q21 which therefore functions as the clamp switching circuit.

The clamp switching circuit provided by the OE input buffer switches the pseudo-rail NODE A between the two clamp levels of 0 volts and −1.5 volts with the following effect. With OE signal high and NODE A held at −1.5 volts, the output is held through the further voltage drop of emitter follower output buffer transistor element Q5 at a low cutoff voltage level just above the −2 volts $V_{TT}$ potential level conventionally applied at the output. The pseudo-rail circuit can control the NODE A for many output gates with a small current of for example 1 mA. The pseudo-rail circuit of the present invention therefore provides a cutoff driver circuit that controls the output effectively from the high potential level power rail by substituting the pseudo-rail node. The pseudo-rail circuit is capable of shifting the pseudo-rail node potential level between a high and low level with relatively smaller power requirements.

The present invention creates a shiftable pseudo-rail NODE A for a cutoff driver circuit that is voltage controlled using level shifts and clamps with reference to the $V_{CC}$ power rail ground potential. The prior art circuit is current controlled, requires the cutoff transistor element Q2, and the abnormally large current of 2 current sinks. The pseudo-rail circuit eliminates the cutoff transistor element and current controlled cutoff with its increased power dissipation.

Figure 2:
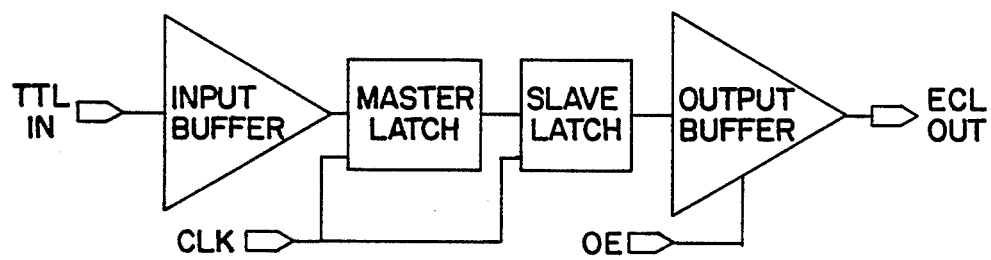
FIG. 2 is a schematic block diagram of a prior art TTL to ECL latch circuit.
Figure 2A:
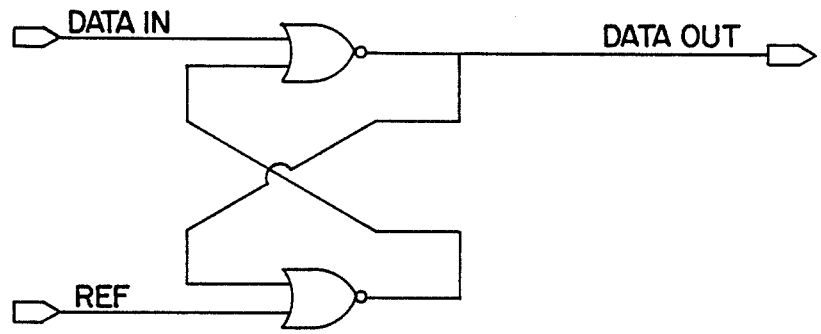
FIG. 2A is a simplified detailed logic circuit diagram of the contents of the slave latch stage of FIG. 2.
Figure 4:
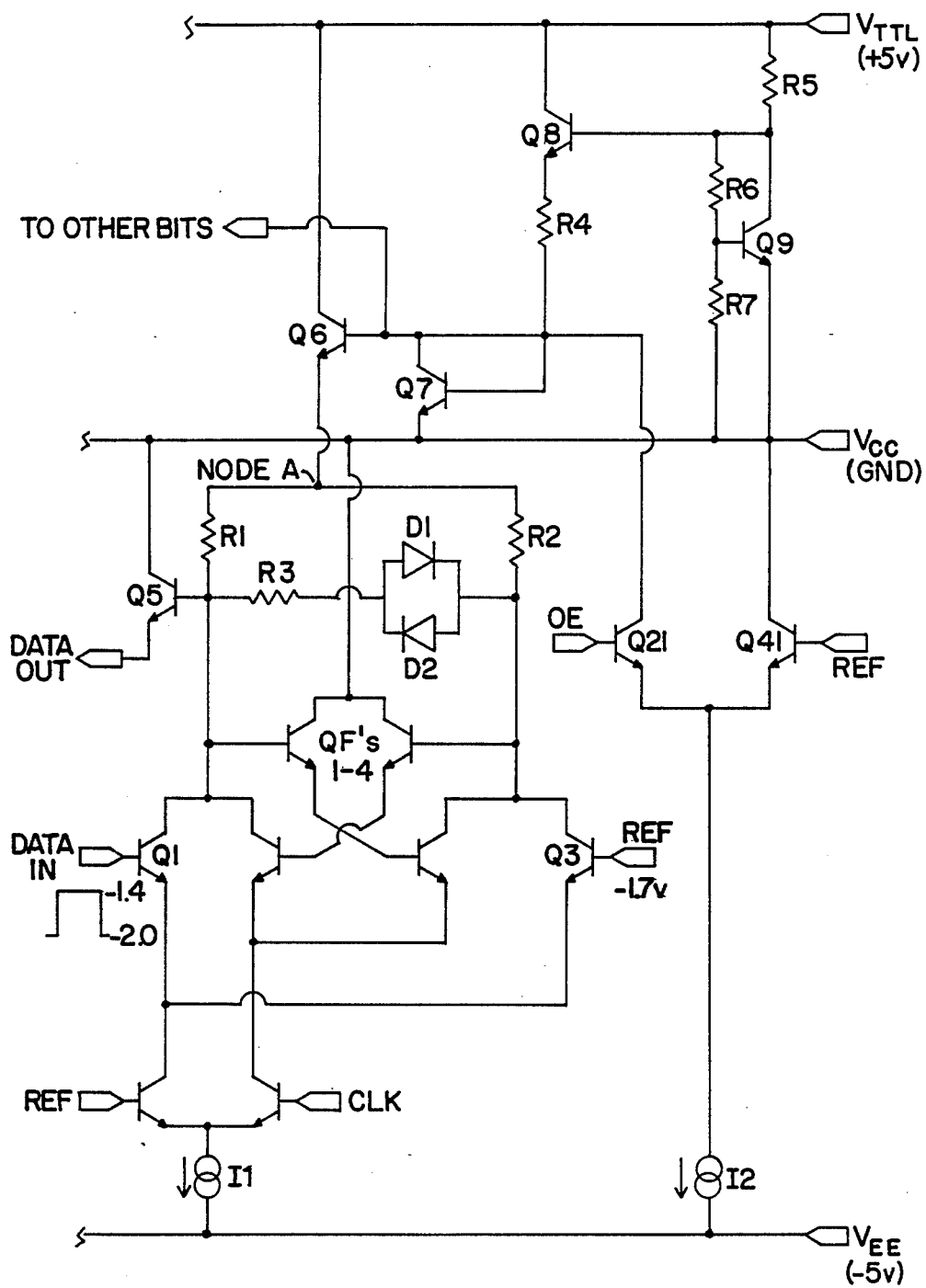
FIG. 4 is a schematic circuit diagram of a latch circuit such as the slave latch stage directly incorporating the pseudo-rail circuit and output buffer into the latch circuit as a cutoff driver circuit.
Figure 5:
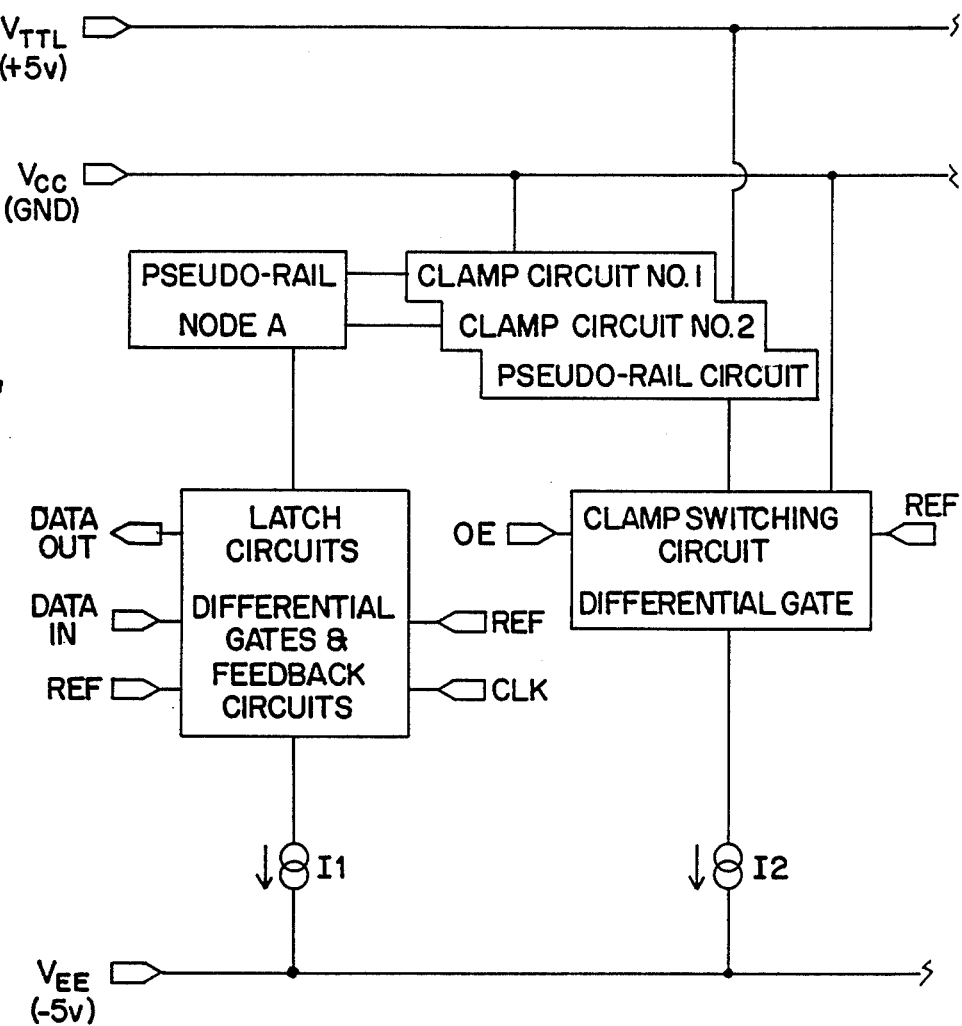
FIG. 5 is a schematic block diagram of the functional blocks of the circuit of FIG. 4.

Application of the pseudo-rail circuit as a cutoff driver and output buffer incorporated directly into a latch circuit is illustrated in FIGS. 4 and 5. FIGS. 4 and 5 show the contents of a latch circuit such as the slave latch stage of FIG. 2 with the output buffer incorporated directly into the latch circuit thereby avoiding an additional output buffer stage with additional stage delay. The components of FIG. 4 performing the same or similar function as the components of the circuit of FIG. 3 are indicated by the same reference designations. The latch portion of this circuit in addition to the basic ECL differential gate Q1, Q3, I1 includes the feedback transistor elements QF1-4 incorporated in appropriate cross feedback circuits. As heretofore described, the data output OUT through output buffer emitter follower transistor element Q5 is taken from an output switching NODE B. NODE B also provides a feedback switching node for a feedback circuit which holds latched data. The feedback circuits holding latched data operate based upon relative voltage differences on the DATA IN and REF signal lines whatever the voltage level applied at the collector nodes of the latch transistor elements. Because NODE A pulls down equally the potential level at the collector nodes, the relative voltage differences are preserved and the latch is not disturbed. More specifically, the feedback circuits are not disturbed and any latch data is preserved. The functional blocks of the latch circuit of FIG. 4 are summarized in FIG. 5.

While the invention has been described with reference to applications of the pseudo-rail circuit in cutoff driver circuits and latch circuits, the invention is suitable for other applications requiring multiple voltage signal levels in a logic circuit. For example the pseudo-rail circuit described in FIG. 3 is applicable for three valued logic circuits requiring three logic value voltage levels. The pseudo-rail circuit may incorporate additional clamp circuits for other multi-valued logic applications. The invention is therefore intended to cover all variations, equivalents and applications within the scope of the following claims.

I claim:

1. An emitter coupled logic or current mode logic (ECL/CML) circuit having a differential gate or buffer coupled between relatively high and low potential level power rails comprising:

a pseudo-rail circuit coupled between the differential gate and said high potential level power rail, said pseudo-rail circuit comprising a pseudo-rail node, a first clamp circuit coupled to the pseudo-rail node for clamping said pseudo-rail node substantially at a first potential level in response to a first control signal, and a second clamp circuit coupled to said pseudo-rail node for clamping said pseudo-rail node at a second potential level below said first potential level in response to a second control signal.

2. The ECL/CML circuit of claim 1 wherein the pseudo-rail circuit comprises a clamp switching circuit coupled to the first and second clamp circuits for alternately applying the first and second clamp circuits to said pseudo-rail node in response to said first and second control signals.

3. The ECL/CML circuit of claim 2 wherein the clamp switching circuit comprises an output enable (OE) differential gate with first and second OE gate transistor elements, at least one of said OE gate transistor elements being coupled to the first and second clamp circuits for alternately applying the first and second clamp circuits to the pseudo-rail node in response to first and second OE control signals.

4. The ECL/CML circuit of claim 1 wherein the first clamp circuit applies the high potential level of the high potential level power rail to the pseudo-rail node.

5. The ECL/CML circuit of claim 4 wherein the first clamp circuit comprises a clamp emitter follower transistor element (Q6) coupled to the pseudo-rail node and inverse voltage drop means coupled between the clamp emitter follower transistor element (Q6) and the high potential level power rail, said inverse voltage drop means (Q7) having a voltage drop substantially equal and opposite to the voltage drop across the clamp emitter follower transistor element for applying the high potential level of the high potential level power rail to the pseudo-rail node.

6. The ECL/CML circuit of claim 5 wherein the inverse voltage drop means comprises a base collector shorted (BCS) transistor element for applying the high potential level of the high potential level power rail to the pseudo-rail node when the clamp emitter follower transistor element and BCS transistor element are both conducting.

7. The ECL/CML circuit of claim 1 wherein the second clamp circuit comprises a clamp emitter follower transistor element (Q6) coupled to the pseudo-rail node, a pulldown transistor element (Q21) coupled between the clamp emitter follower transistor element and said low potential level power rail, and voltage level setting means (R4) coupled to a node between the clamp emitter follower transistor element and pulldown transistor element for holding the pseudo-rail node at a specified potential level below said high potential level of the high potential level power rail when the pulldown transistor element is conducting.

8. The ECL/CML circuit of claim 4 wherein the pseudo-rail circuit comprises a cutoff driver circuit, wherein the differential gate comprises an output switching node for delivering output signals to an output, wherein the output switching node is coupled to the pseudo-rail node, and wherein the second potential level of the second clamp circuit is selected to hold the output switching node and output of the differential gate in the cutoff state in response to a cutoff OE control signal.

9. The ECL/CML circuit of claim 8 wherein the differential gate is part of a latch circuit comprising a feedback circuit for holding latched data, wherein the switching output node of the differential gate is coupled to an output for delivering output signals and to said feedback circuit of the latch circuit for delivering feedback signals to hold latched data, and wherein the cutoff driver circuit holds the differential gate and output in the cutoff state in response to an OE cutoff signal without losing latched data.

10. In an ECL/CML circuit with a differential gate or buffer coupled between relatively high and low voltage level power rails, said differential gate having a pair of gate transistor elements providing an input for receiving input signals of high and low potential, and a switching output node for delivering output signals of high and low potential to an output, a cutoff driver means operatively coupled to the differential gate for holding the differential gate and output in a cutoff state in response to an OE signal comprising:

a pseudo-rail circuit coupled between the differential gate and said high voltage level power rail, said pseudo-rail circuit comprising a pseudo-rail node operatively coupled to the switching output node, a first clamp circuit coupled to the pseudo-rail node and constructed and arranged to clamp the pseudo-rail node substantially at the high voltage level of the high voltage level power rail in response to a first OE signal for switching operation of the switching output node, and a second clamp circuit coupled to the pseudo-rail node for clamping the pseudo-rail node at a voltage level substantially below said high voltage level for holding the differential gate and output in a cutoff state in response to a second OE signal.

11. The ECL/CML circuit of claim 10 wherein the pseudo-rail circuit comprises a clamp switch circuit coupled to the first and second clamp circuits for alternately applying the first and second clamp circuits to the pseudo-rail node in response to said first and second OE signals.

12. The ECL/CML circuit of claim 11 wherein the clamp switch circuit comprises an OE signal differential gate with first and second OE gate transistor elements, at least one of said OE gate transistor elements being coupled to the first and second clamp circuits for alternately applying the first and second clamp circuits to the pseudo-rail node in response to said first and second OE control signals.

13. The ECL/CML circuit of claim 12 wherein the first clamp circuit comprises a clamp emitter follower transistor element (Q6) coupled to the pseudo-rail node and inverse voltage drop means (Q7) coupled between the clamp emitter follower transistor element (Q6) and the high potential level power rail, said inverse voltage drop means having a voltage drop substantially equal and opposite to the voltage drop across the clamp emitter follower transistor element for applying the high voltage level of the high voltage level power rail to the pseudo-rail node.

14. The ECL/CML circuit of claim 13 wherein the second clamp circuit comprises said clamp emitter follower transistor element (Q6) coupled to the pseudo-rail node, a pulldown transistor element (Q21) coupled between the clamp emitter follower transistor element and said low potential level power rail, and voltage level setting means (R4) coupled to a node between the clamp emitter follower transistor element and pulldown transistor element for holding the pseudo-rail node at a specified level below said high potential level of the high potential level power rail when the pulldown transistor element is conducting.

15. The ECL/CML circuit of claim 10 wherein the ECL/CML circuit comprises a latch circuit including a feedback circuit for holding latched data, said differential gate forming a gate of the latch circuit and an output buffer for the latch circuit, said switching output node of the differential gate being coupled to an output for delivering output signals and to a feedback circuit of the latch circuit for delivering feedback signals to hold latched data, and wherein the cutoff driver circuit holds the differential gate and output in the cutoff state in response to the second OE signal without losing latched data.

16. An ECL/CML latch circuit comprising:
a differential gate with feedback circuits for holding latched data signals;
said differential gate being coupled between relatively high and low potential level power rails;
said differential gate comprising a pair of gate transistor elements providing an input for receiving input data signals of high and low potential and a switching output node for delivering output data signals of high and low potential to an output;
a pseudo-rail circuit coupled between the differential gate and said high potential level power rail, said pseudo-rail circuit comprising a pseudo-rail node operatively coupled to the switching output node;
said pseudo-rail circuit comprising a first clamp circuit coupled to the pseudo-rail node and constructed and arranged to clamp the pseudo-rail node substantially at the high potential level of the high potential level power rail in response to a first OE signal for switching operation of the switching output node;
said pseudo-rail circuit comprising a second clamp circuit coupled to the pseudo-rail node for clamping the pseudo-rail node at a potential level substantially below said high potential level power rail for holding the differential gate and output in a cutoff state in response to a second OE signal;
said pseudo-rail circuit being arranged to hold the differential gate and output in the cutoff state in response to said second OE signal without losing latched data signals held by the feedback signals of the latch circuit.

17. The ECL/CML latch circuit of claim 16 wherein the differential gate comprises first and second input transistor elements with respective first and second input signal differential base circuits providing differential inputs for receiving input data signals of high and low potential, and first and second switching output nodes providing output data signals of high and low potential at first and second differential outputs;
wherein the latch circuit comprises first and second feedback circuits coupled respectively to the first and second output switching nodes for latching data signals at the differential outputs;
said pseudo-rail circuit being constructed and arranged to hold the differential gate and first and second outputs in the cutoff state in response to said second OE signal without losing said latched data signals.

18. The ECL/CML latch circuit of claim 17 wherein the pseudo-rail circuit comprises a clamp switch circuit operatively coupled to the first and second clamp circuits for alternately applying said first and second clamp circuits to the pseudo-rail node in response to the first and second OE control signals.

19. The ECL/CML latch circuit of claim 18 wherein the clamp switch circuit comprises an OE signal differential gate.

* * * * *